United States Patent [19]
Chiang

[11] Patent Number: 5,535,150
[45] Date of Patent: Jul. 9, 1996

[54] SINGLE CHIP ADAPTIVE FILTER UTILIZING UPDATABLE WEIGHTING TECHNIQUES

[75] Inventor: Alice M. Chiang, Weston, Mass.

[73] Assignee: Massachusetts Institute of Technology, Cambridge, Mass.

[21] Appl. No.: 388,170

[22] Filed: Feb. 10, 1995

Related U.S. Application Data

[63] Continuation of Ser. No. 49,707, Apr. 20, 1993, abandoned.

[51] Int. Cl.⁶ .................................................. G06F 15/31
[52] U.S. Cl. .................................................... 364/724.19
[58] Field of Search .......................... 364/724.19, 724.2, 364/724.01, 606, 844

[56] References Cited

U.S. PATENT DOCUMENTS

| | | | |
|---|---|---|---|
| 4,149,259 | 4/1979 | Kowalski | 364/724 |
| 4,234,930 | 11/1980 | Campbell | 364/724.11 |
| 4,464,726 | 8/1984 | Chiang | 364/844 |
| 4,489,309 | 12/1984 | Schlig | 340/347 AD |
| 4,605,826 | 8/1986 | Kanemasa | 179/170.2 |
| 4,696,015 | 9/1987 | Palicot et al. | 364/724.19 |
| 4,771,396 | 9/1988 | South et al. | 364/724.16 |
| 4,862,402 | 8/1989 | Shah et al. | 364/724.12 |
| 4,947,362 | 8/1990 | Bui | 364/724.19 |
| 4,947,363 | 8/1990 | Williams | 364/724.19 |
| 5,045,945 | 9/1991 | Herman et al. | 358/167 |
| 5,050,186 | 9/1991 | Gurcan et al. | 364/724.20 |
| 5,111,419 | 5/1992 | Morley, Jr. et al. | 364/724.19 |
| 5,168,459 | 12/1992 | Hiller | 364/724.19 |
| 5,285,475 | 2/1994 | Kurokami | 364/724.19 |
| 5,309,378 | 5/1994 | Beierle | 364/724.19 |
| 5,313,411 | 5/1994 | Tsujimoto | 364/724.19 |
| 5,327,459 | 7/1994 | Hara et al. | 364/724.2 |

OTHER PUBLICATIONS

B. Ahuja et al., "A Sampled Analog MOS LSI Adaptive Filter", IEEE Transactions on Communications, vol. COM-27, No. 2, Feb. 1979, pp. 406-412.

*Primary Examiner*—Tan V. Mai
*Attorney, Agent, or Firm*—Samuels, Gauthier, Stevens & Reppert

[57] ABSTRACT

A single chip adaptive filtering system including an finite impulse response (FIR) filter and circuitry for calculating updated weighting coefficients for use in associated multiplying digital-to-analog converters. The adaptive FIR filter performs the convolution of a delayed and sampled input sequence to produce a filter output. Thereafter, an error term is determined by calculating the difference between the filter output and a reference signal which corresponds to a predetermined anticipated output of the filter. The error term is then applied to a least mean square (LMS) estimation algorithm for computing updated weighting coefficients to be used by the adaptive FIR filter.

40 Claims, 4 Drawing Sheets

SINGLE CHIP ADAPTIVE FILTER UTILIZING UPDATABLE WEIGHTING TECHNIQUES

This invention was made with government support under Contract Number F19628-90-C-0002 awarded by the Air Force. The government has certain rights in the invention.

This is a continuation of application Ser. No. 08/049,707 filed on Apr. 20, 1993, now abandoned.

BACKGROUND OF THE INVENTION

The invention is directed to a single chip adaptive filter which utilizes updatable filter weights.

In many communication, control or terrestrial/cable television transmission systems, received input signals often consist of the sum of a desired signal and an undesired noise or interference. A signal processor is required to estimate or recover the desired signal in the presence of the additive interference noise. Significant research efforts have been dedicated toward this type of signal estimation problem. One conventional approach for solving these problems includes the use of an adaptive finite-impulse (FIR) filter which removes the interference and produces an output that approximates the desired signal. The filter weights required to achieve the optimum performance can be determined from a least mean square (LMS) algorithm based on a gradient optimization. Applications for real-time adaptive filtering techniques are in such diverse fields as adaptive control, ghost cancellation in terrestrial and cable TV transmission, channel equalization for communication and magnetic recording, estimation/prediction for speech processing, adaptive noise cancellation in electrocardiogram, etc.

The predominant hardware challenges for implementation of such filtering devices are the development of processors capable of providing a large number of computations with low power consumption and low cost production. The computations required are divided between those carried out for the realization of the FIR filter, e.g. requiring the repetitive calculation of a sum of products, and those calculations for the adaptation of the filter, e.g. requiring a large number of multiplication steps and simple IIR (Infinite Impulse Response) filters.

An important example of a specific application requiring massive computations at low cost is the problem related to ghost cancellation in television systems. Several attempts have been made for standardizing ghost cancellation systems, all of which are generally similar to one another as discussed in Tawil et al., "Field Testing of a Ghost Canceling System for NTSC Television Broadcasting", IEEE trans. on Broadcasting volume 36, no. 4, pages 255–261, 1990. A standard reference would be incorporated into the transmitted signal at predictable time intervals. The received signal, distorted by multipath transmission, would be passed through an adaptive FIR filter and at the predictable time intervals when the references known to be present, the weights of the filter would be adapted so that the actual output comes to closely resemble the standard reference. At the times when the reference is not present, the adaptation would stop, but the FIR filter would continue to filter the signal to suppress the multipath interference.

The ghost canceling application requires adaptive FIR filtering which utilizes at least a few hundred taps. Using conventional digital circuits, a ghost canceler would have to be a multi-chip system. For example, a block diagram of a ghost cancellation system 10 which is conventionally utilized for terrestrial and cable TV transmission is shown in FIG. 1. An analog base band video input signal from input signal source 11 is passed through an analog-to-digital converter 12 for conversion to a digital signal. The input signal is also provided to a synchronization circuit 13 for extracting synchronization signals and phase-locked sample clock signals. The digital video signal is then fed to a digital FIR filter 14 which utilizes electrically programmable filter coefficients. The digital video signal is also provided to a DSP processor 15 which examines a captured single line or "training signal" which is known to contain the reference signal. The DSP processor carries out an adaptation algorithm stored in ROM/RAM memory 16 in order to calculate the filter coefficients necessary to cancel any imperfections in the channel. The filter coefficients are then downloaded to the FIR filter 14, which in turn performs the filtering operation on the rest of the video signal. The output of the FIR filter is fed to a video rate D/A converter 17 for producing the output signal 18 which is supplied to the video signal receiver. This type of system inherently requires an expensive multi-chip configuration, however, due to the fact that ghost cancellation systems will ideally be provided in many television receivers, an inexpensive realization for carrying out the same filtering function is very desirable.

SUMMARY OF THE INVENTION

It is therefore an object of the present invention to provide a single-chip adaptive filtering system.

It is another object of the present invention to provide an adaptive filtering system which utilizes updatable filter weighting coefficients which are derived from the output of the filter.

Accordingly, the present invention is an adaptive filtering system including a multi-stage signal input tapped delay line having a plurality of storage modules operable for successively shifting discrete samples of an input signal along the delay line; a plurality of multipliers respectively associated with each of the storage modules, each of the multipliers operable for generating an output corresponding to the product of the discrete sample of the input signal received from an associated storage module and an updatable weighting coefficient; a summation circuit operable for providing an output signal corresponding to the sum of the products generated from the multipliers; and a weighting coefficient updating circuit operable for providing updatable weighting coefficients to each of the multipliers, the updating circuit generating each of the updatable weighting coefficients as the sum of a predetermined weighting coefficient and an updating factor.

DETAILED DESCRIPTION OF THE ILLUSTRATED EMBODIMENTS

Figure 1:
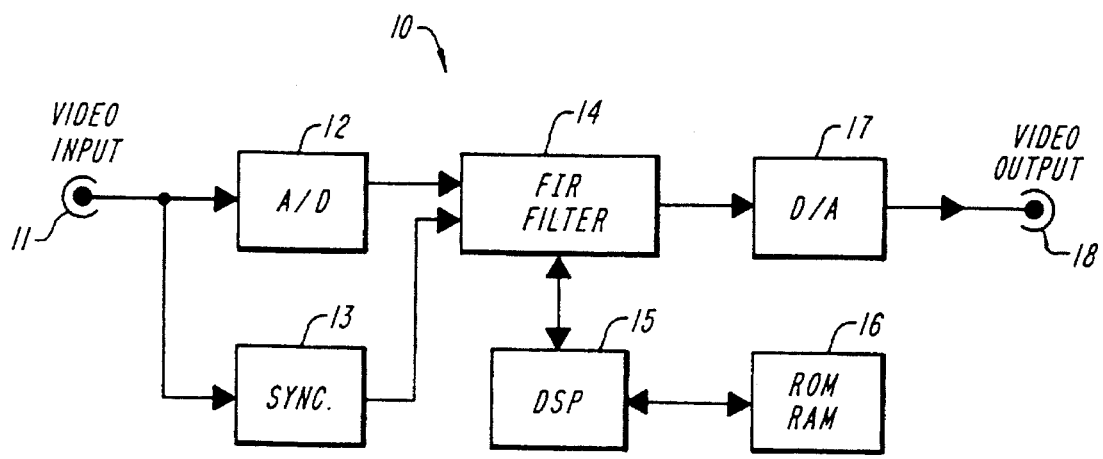
FIG. 1 shows a block diagram of a prior art ghost cancellation/adaptive filtering system.
Figure 2:
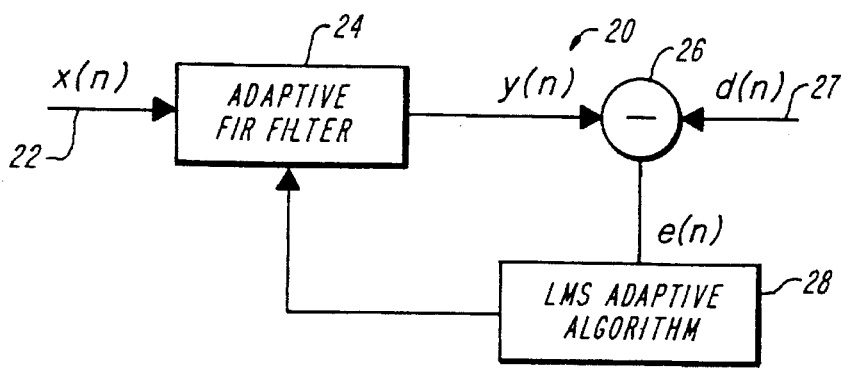
FIG. 2 shows a block diagram of the single chip adaptive filter in accordance with the present invention.

With reference now to FIG. 2, a block diagram of the single chip adaptive filtering system 20 in accordance with the present invention is shown. In the system 20, a sampled input sequence x(n) is provided to an adaptive FIR filter section 24 which performs the convolution of the sampled input sequence to produce the filter output y(n). Thereafter, an error term $\epsilon(n)$ is determined by calculating the difference between the filter output y(n) and a reference signal d(n), which corresponds to a predetermined anticipated output of the filter, from a reference signal source 27 by a comparator/differencing circuit 26. The error term $\epsilon(n)$ is then applied to a least mean square (LMS) estimation algorithm for computing updated weighting coefficients to be used by the adaptive FIR filter 24.

In the filtering system 20 of the present invention which utilizes an FIR filter with N taps, a least mean square (LMS) estimation technique is used for the weight update computation. Specifically, for a sampled input sequence x(n), the system computes the output $$y(n) = \sum_{k=0}^{N-1} x(n-k) w_k(n) \tag{1}$$

and thereafter the weights $w_k(n)$ are also updated using the LMS algorithm. Preferably, the system uses an N-stage adaptive FIR with adjustable weight $w_k(n)$ for tap k at the nth sampling instant and N parallel processing elements which each compute the weight update of each tap according to the LMS algorithm.

Ideally, the filter output y(n) will be equal to the reference d(n), otherwise an error signal is formed:

$$\epsilon(n) = d(n) - y(n) = d(n) - \sum_k x(n-k) w_k(n) \tag{2}$$

Thereafter, the error power is minimized according to the following:

$$E = \sum_n [d(n) - y(n)]^2 = \sum_n \epsilon(n) \left[ d(n) - \sum_k w_k x(n-k) \right] \tag{3}$$

Since E depends on each weight $w_k$, a prediction may be made as to how E varies if the adjustable weighting coefficient $w_k$ is varied. The variation in E would be proportional to $\partial$ of $E/\partial$ of $w_k$ which is as follows:

$$\frac{\partial E}{\partial w_k} = -\sum_n \epsilon(n) x(n-k) \tag{4}$$

However, in the LMS algorithm the components of the gradient are estimated using only the instantaneous term $$\xi\left(\frac{\partial E}{\partial w_k}\right) = -\epsilon(n) x(n-k) \tag{5}$$

and each weight $w_k(n)$ is updated by an amount proportional to $\xi(\partial E/\partial w_k)$, but oppositely directed as:

$$w_k(n+1) = w_k(n) + \mu\epsilon(n) \times (n-k) \tag{6}$$

where $\mu$ is a constant which determines the stability and the convergence rate of the iterative process.

According to an alternate variation of the algorithm, the weights $w_k(n)$ are not updated every iteration, but only every pth iteration, using a better approximation of the gradient.

$$\xi\left(\frac{\partial E}{\partial w_k}\right) = -\sum_{i=0}^{p-1} \epsilon(n-i) x(n-i-k) \tag{7}$$

and hence $$w_k(n+p) = w_k(n) + \Delta_k \tag{8}$$

$$\Delta k = \mu \sum_{i=0}^{p-1} \epsilon(n-i) x(n-i-k) \tag{9}$$

Based on the derivations provided, the implementation of an adaptive FIR filter with the use of an LMS algorithm requires two calculations. The first calculation involves a computation of the error signal, $\epsilon(n)$ according to Equation (2) and thereafter computing the updated filter weight $w_k(n+p)$ according to Equations (8) and (9). As can be derived from Equation (2), in order to calculate the error term $\epsilon(n)$, initially a FIR filter is needed to perform the convolution of the input sequence, x(n), with the tap weights $w_k$, and thereafter a computation is needed to provide the difference between the filter output and the anticipated output d(n). For the weight updating calculation, a parallel pipelined architecture is preferably used, in which each weight update term $\Delta_k$ is computed with a multiplier followed by an accumulator, thus multiplying the error term $\epsilon(n)$ by a properly delayed input and then accumulating the products for p iterations.

Figure 3:
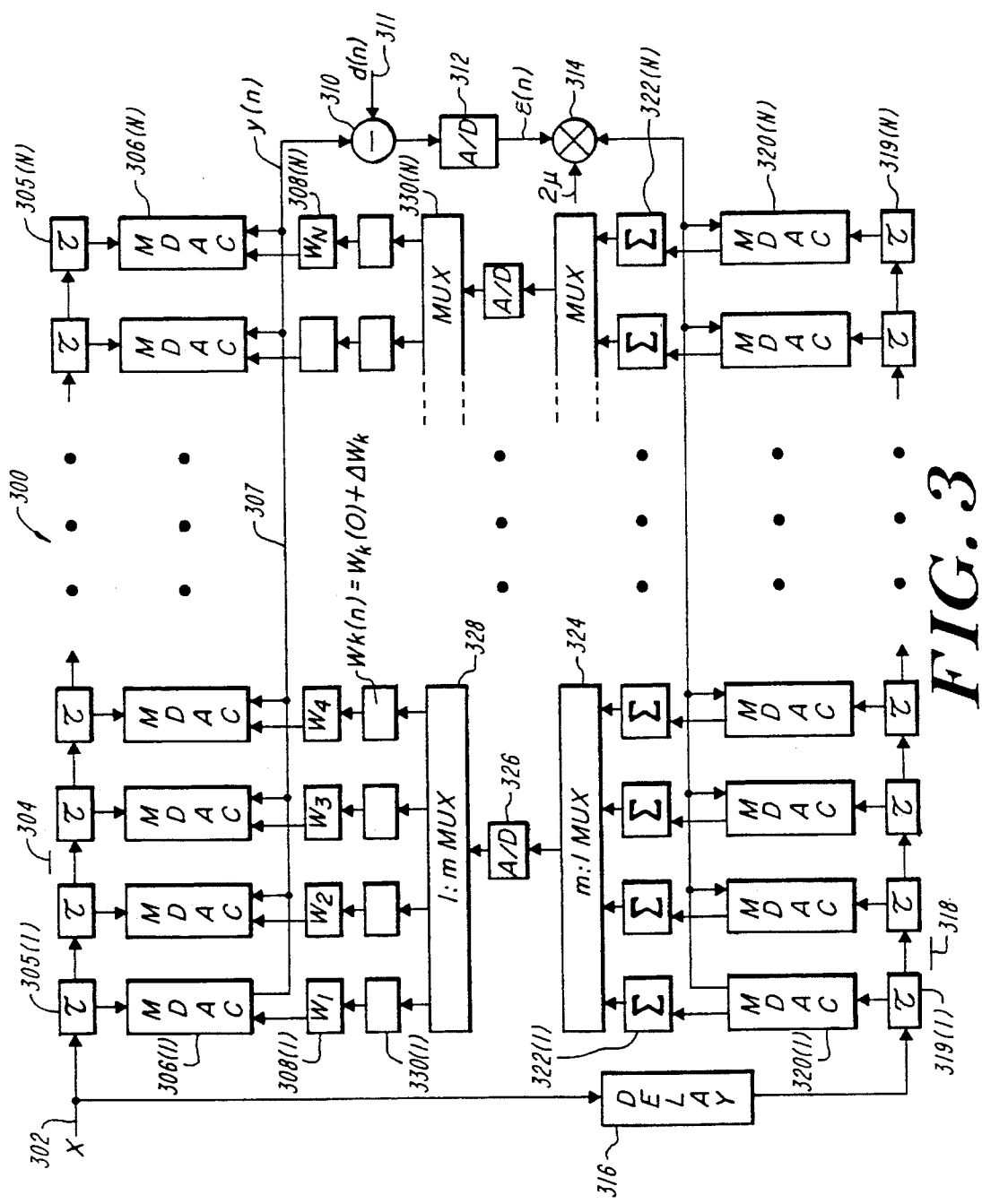
FIG. 3 shows a more detailed block diagram of the single chip adaptive filter of the present invention.

With reference now to FIG. 3, one embodiment of the adaptive filtering system 300 in accordance with the present invention is shown for use with analog input signals and digital weighting coefficients. Initially, an analog signal is provided from an input signal source 302 to a N-stage tapped delayed line 304 having N number of memory modules 305(1) through 305(N) for starting the convolution/correlation operation. For charge domain applications, the tapped delay line is a charge-transfer device such as a charge-coupled device (CCD) shift register, and therefore the memory modules 305 are implemented as sensing floating gates. Accordingly, a succession of discrete charge samples from the input sequence x(n), which are linearly related to the sampled input voltage, are propagated down the tapped delay line 304 in a shift and hold sequence. As a charge packet moves into a potential well beneath one of the sensing floating gates, a charge is induced on each gate segment which is proportional to the input signal x(n).

Each of the memory modules 305(1)–305(N) is coupled to the analog input of an associated one of digital-analog multiplying devices 306(1) through 306(N). The digital inputs to the multipliers are supplied with updatable weighting coefficients from digital memory modules 308(1) through 308(N). The output from each multiplier is a charge packet which is proportional to the product of the analog potential at the analog input gate from the sensing floating gate and the digital signal at the digital input. All of the multipliers have a common output node 307, which functions as a device for summing the charge packets applied thereto by the multipliers. The output from the multiplying stage is an analog quantity in the sum of the product operation $$\sum_{k=0}^{N} x(n-k) w_k(n) \tag{10}$$

which is performed in analog form.

The multiplying devices 306(1)–306(N) are preferably multiplying digital-to-analog converters (MDAC). Each MDAC has M-bit accuracy, with one analog input, M-parallel digital inputs, and one analog output.

Figure 4:
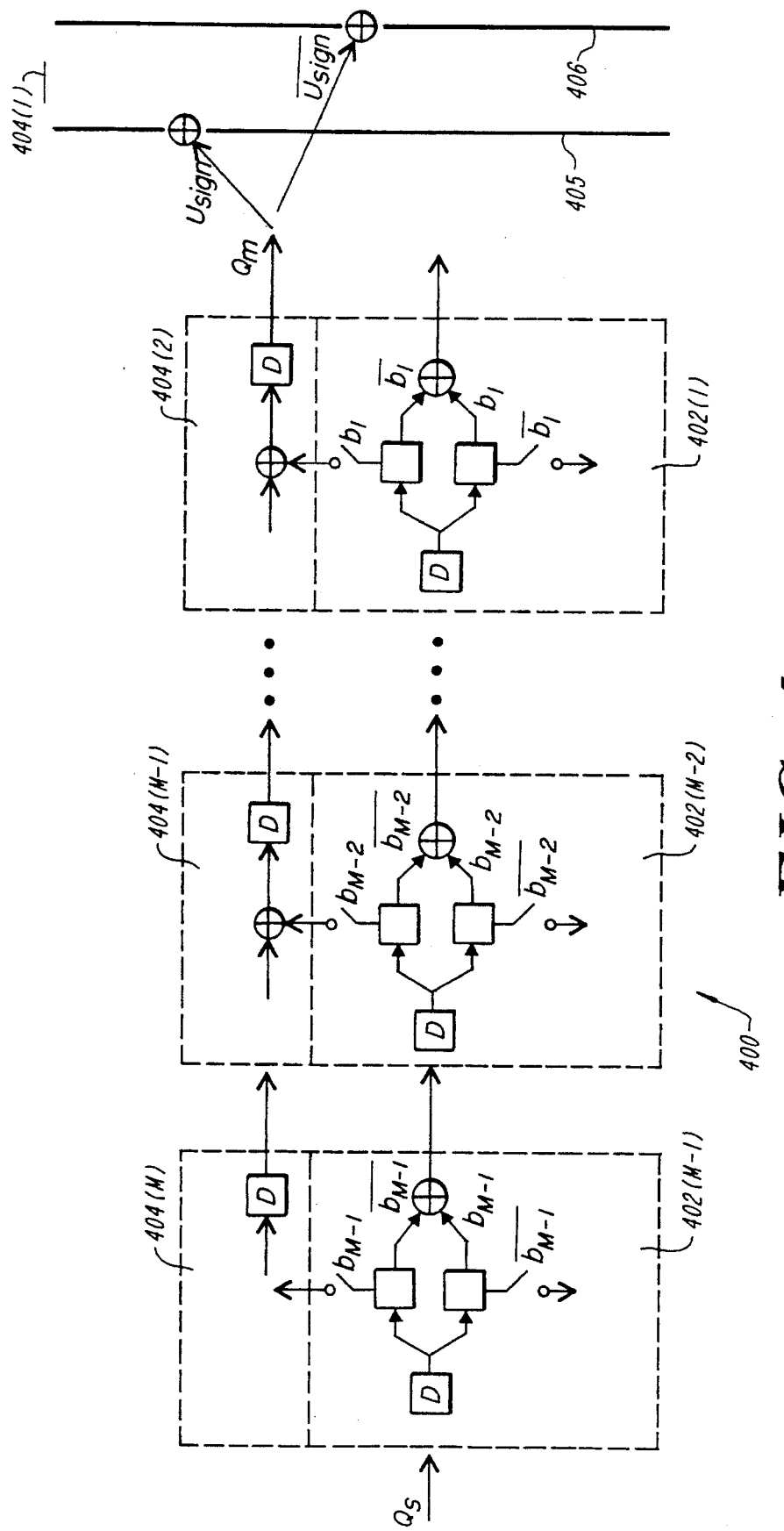
FIG. 4 shows a detailed block diagram of a bit serial pipelined multiplying digital-to-analog converter.

According to a preferred embodiment of the present invention, a bit-serial, pipelined multiplying digital-to-analog converter 400 is utilized as shown in FIG. 4. The bit-serial pipelined MDAC can be used to compute the product of a bipolar analog quantity with a M-bit digital word in signed-magnitude representation.

In such a direct-multiplication digital multiplier for numbers in signed-magnitude representation, the multiplicand, A, is a L-bit word and the multiplier, B, is a M-bit word as shown below $$A = a_L + \sum_{i=1}^{L-1} a_{L-i} 2^{-i} = a_L + A^* \quad (11)$$

$$B = b_M + \sum_{i=1}^{M-1} b_{M-i} 2^{-i} = b_M + B^* \quad (12)$$

where $a_i$ and $b_i$ are either 0 or 1. $A^*$ and $B^*$ represent the number bits. $a_L$ and $b_M$ are the sign bits, 0 and 1 representing, respectively, the positive and negative sign. Letting the product be the number U, the result is $$U = AB = u_{sign} + A^* B^* = u_{sign} + A^* b_{M-1} 2^{-1} + A^* b_{M-2} 2^{-2} + \ldots + A^* b_1 2^{-(M-1)} \quad (13)$$

Since the $b_i$'s are merely 0 or 1 the binary multiplication is merely repeated addition operations, with the multiplicand properly shifted. The sign digit of the product $u_{sign}$ is the XOR of the sign bits $a_L$ and $b_M$.

In a charge-domain bit-serial pipelined implementation of the direct multiplication, the bipolar analog multiplicand A is represented by an analog charge packet $Q_S$ and a sign bit. If the input is a 10-bit word plus a sign word, the charge packet will represent the 10-bit value. To calculate the magnitude product of $Q_S B^*$ as in the above Equation (13), only dividing the charge by two and addition operations are required. The M-bit multiplier is represented by two's complement notation, i.e.

$$\sum_{i=1}^{M-1} 2^{-i} b_{M-i} \quad (14)$$

plus a sign bit $b_M$.

As shown in FIG. 4, the multiplier 400 includes M-1 delay and divide-by-two circuits 402(1) through 402(N-1), and a M-stage output summing-and-delay buffer 404(1) through 404(M). During the first clock period, the input analog charge packet $Q_s$ is divided into two identical parts, each one represented by $Q_s/2$. The processing path of one of the charge portions is controlled by the value of $b_{M-1}$, and the other half is always transferred to the next divide-by-two stage. For example, if $b_{M-1}=1$, a charge packet equaling to $Q_s/2$ will be transferred to the output summing buffer located at the top of the multiplier and the other charge packet will be transferred to the next delay and divide-by-two circuit. On the other hand, if $b_{M-1}=0$, a charge packet equal to $Q_s/2$ will be discarded to an output drain, while the other half will be transferred to the next delay and divide-by-two circuit.

As shown in FIG. 4, the charge transfer is controlled by both $b_i$ and its complement $\bar{b}_i$. If $b_i$ is 1, the gate connected to this bit is then on, if $b_i$ is 0, the gate is off. For example, if $b_i$ is 1, then $\bar{b}_i$ is 0, it follows then that the gate connected to the output buffer is on, and the gate connected to the output drain is off. There are two gates controlling the charge packet transferred to the next delay stage: one gate is controlled by $b_i$ and the other by $\bar{b}_i$. No matter what the value of $b_i$, one gate is always open. Therefore, one half of the charge will always be transferred to the next delay stage.

During the next clock period, the same operation repeats in the subsequent stages. Outputs of the subsequent divide-by-two circuit will be two charge packets, each portion equalling to $Q_s/4$. Again, one charge packet is transferred to the next delay stage, while the other charge packet will either be transferred to the second stage of the output summing-and-delay buffer 404 and summed with the charges generated from the previous bit, or it will be discarded, depending on the value of $b_{M-2}$. It follows then, after two stages, the amount of charge in the second stage of the output buffer will equal to $$\sum_{i=1}^{2} Q_s 2^{-i} b_{M-i} \quad (15)$$

Which represents the first two partial product terms shown in Equation (13). These divide-by-two and summing operations repeat for M-1 clocks. The amount of charge in the output buffer will then equal to $$\sum_{i=1}^{M-1} Q_s 2^{-i} b_{M-i} \quad (16)$$

which is the desired output representing the magnitude product of an analog quantity with a digital quantity.

As can be derived from the above description, the multiplier is implemented in a pipelined fashion, a new input-charge packet $Q_s$ can be applied to the multiplier at every clock. After an initial latency time of M-1 clocks, the multiplier 400 will have a continuous throughput rate equal to the input data rate.

In order to compute the final four-quadrant output, the most significant bit of the digital word will be XORed with the sign bit of the analog input. This will generate a control signal for the sign bit, $u_{sign}$, of the final product If the control signal is "1" the charge packet will be transferred to the positive sum-of-the-product node 405, and if equal to "0" it will be transferred to the negative node 406.

Returning now to FIG. 3, the weighting coefficient update computation is described hereinafter. Initially, the input sequence x(n) is provided to a second analog tapped delay line 318 after being delayed a predetermined amount by a delay circuit 316. The delay circuit 316 is provided to compensate for latency timing errors in the filter system elements.

The tapped delay line 318 operates to shift and hold the input sequence along memory modules 319(1) through 319(N). At each memory module of the tapped delay line, the discrete samples of the input sequence are non-destructively sensed and applied to the analog inputs of corresponding multiplying devices 320(1) through 320(N). The digital inputs of the multiplying devices are provided with a digital representation of an error term $\epsilon(n)$, the derivation of which is as follows.

The summed output of y(n) of the multiplying devices 306(1)–306(N) is applied to a comparator/differencing circuit 310, which operates to compare the output y(n) with the reference signal d(n) from the reference signal source 311. If there are any differences between these signals, the error signal $\epsilon(n)$ is produced and converted to a digital signal by A/D converter 312. A multiplier 314 receives the error signal and multiplies it with a convergence factor 2μ. Accordingly, at any predetermined time, all of the multiplying devices 320(1)–320(N) receive the same weighted error signal.

The output of each multiplying device is an analog quantity which is summed in corresponding accumulator circuits 322(1)–322(N) for p clock periods as indicated by Equation (9). After p clock periods, the information stored in each accumulator circuit 322(1)–322(N) represents the desired weighting coefficient update value $\Delta w_k$ for the corresponding filter weight. The weight update values are passed through a m:1 MUX 324, an A/D converter 326, and a 1:m MUX 328 for conversion to a digital representation of the weight update. The weight updates are then applied to updated weighting coefficient digital memory circuits 330(1)–330(N) which operate to combine the weight update with the previously stored weighting coefficient so as to generate the updated weighting coefficient.

Figure 5:
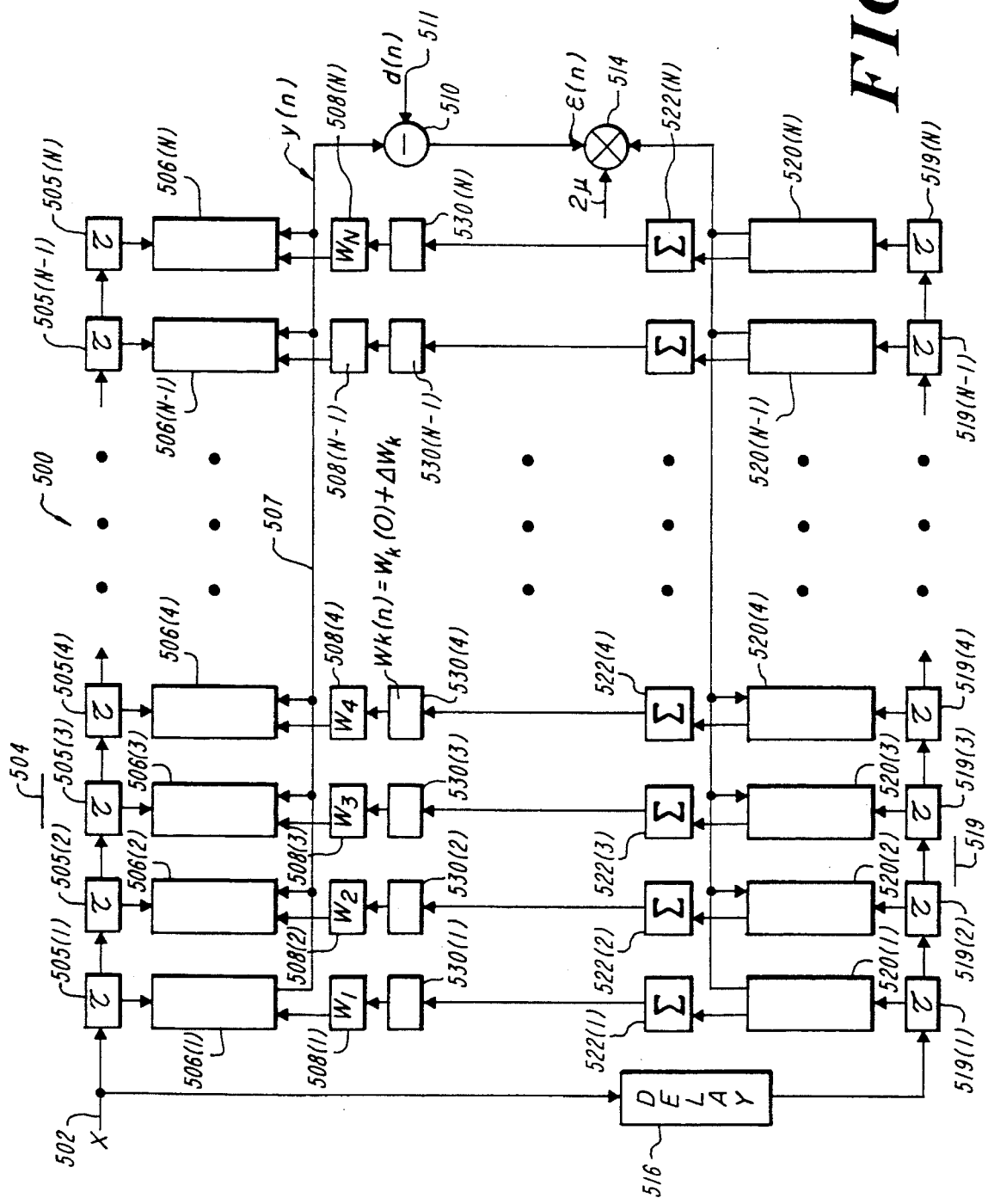
FIG. 5 shows a detailed block diagram of an alternate embodiment of the single chip adaptive filter of the present invention.

According to an alternative embodiment of the present invention, a single chip adaptive filter 500 which utilizes a digital input sequence x(n) and analog weighting coefficients is shown in FIG. 5. In this implementation, the system 500 utilizes many of the same components as the system 300 illustrated in FIG. 3. The system 500, however, utilizes M digital tapped delay lines, each having memory modules 505(1)–505(N), where M represents the accuracy of the input word x(n). The tapped delay line is preferably a charge domain digital shift register which is used to shift and hold the input sequence x(n) from the input signal source 502. At each stage of the tapped delay line, the M-bit digital word is applied in parallel to its corresponding multiplying device 506(1)–506(N). The filter weighting coefficients are stored in analog form in associated analog memory circuits 508(1)–508(N). The multiplying devices are used to compute in parallel the products of the discrete samples of the input sequence with its corresponding filter weight. The output from each multiplying device is an analog quantity representative of the sum of the products generated by the multiplying devices.

The weight update computation is performed by the use of a delay circuit 516, digital tapped delay lines 519, multiplying devices 520(1)–520(N) and summation circuits 522(1)–522(N). The tapped delay line is used to hold and shift the delayed input sequence such that at each stage of the delay, digital inputs are applied to corresponding multiplying devices. The multiplying devices also receive the weighted analog error signal $\epsilon(n)$, and produce an analog output which is summed and a corresponding accumulator circuit for p clock periods. After p clock periods, the information stored in each accumulator circuit represents the desired weight update for the corresponding filter weight. Each weight update is combined in updated weighting coefficient analog memory circuits 530(1)–530(N) in analog form with the previously stored weighting coefficient so as to generate a new filter weight as required in Equations (8) and (9).

What is claimed is:

1. An adaptive filtering system comprising:
   a multi-stage signal input tapped delay line including a plurality of storage modules operable for successively shifting discrete samples of an input signal along said delay line;
   a plurality of parallel multipliers respectively coupled to each of said storage modules, each of said multipliers operable for generating an output corresponding to the product of the discrete sample of said input signal received from a respective storage module and an updatable weighting coefficient;
   a summation circuit operable for providing an output signal corresponding to the sum of said products generated from said multipliers; and
   a weighting coefficient updating circuit operable for simultaneously providing to each of said multipliers distinct and synchronized updatable weighting coefficients as the sum of a predetermined weighting coefficient and an updating factor, said updating factor corresponding to a product of discrete samples of said input signal and discrete portions of an error signal determined as the difference between said output signal and a predetermined reference signal, wherein
   said updating circuit comprises a second multi-stage signal input tapped delay line including a second plurality of storage modules operable for successively shifting discrete samples of said input signal along said second delay line, and a second plurality of multipliers respectively coupled to each of said second plurality of storage modules, each of said second multipliers operable for generating an output corresponding to the product of the discrete sample of said input signal received from a respective second storage module and said discrete portions of said error signal.

2. The adaptive filter of claim 1, further comprising a differencing circuit coupled between said summation circuit and a reference signal source, said differencing circuit operable for calculating said error signal and providing it to said updating circuit.

3. The adaptive filter of claim 1, wherein said updating circuit comprises a second multi-stage signal input tapped delay line including a second plurality of storage modules operable for successively shifting discrete samples of said input signal along said second delay line.

4. The adaptive filter of claim 3 further comprising a delay circuit through which said input signal passes prior to being applied to said second delay line.

5. The adaptive filter of claim 3, wherein said updating circuit further comprises a second plurality of multipliers respectively coupled to each of said second plurality of storage modules, each of said second multipliers operable for generating an output corresponding to the product of the discrete sample of said input signal received from a respective second storage module and said discrete portions of said error signal.

6. The adaptive filter of claim 5, wherein said updating circuit further comprises a second summation circuit operable for providing an output signal corresponding to said updating factor.

7. The adaptive filter of claim 5, wherein said second delay line comprises a charge transfer device.

8. The adaptive filter of claim 7, wherein said charge transfer device comprises a charge coupled device shift register.

9. The adaptive filter of claim 1, wherein said delay line comprises a charge transfer device.

10. The adaptive filter of claim 9, wherein said charge transfer device comprises a charge coupled device shift register.

11. The adaptive filter of claim 10, wherein said discrete samples of said input signal comprise charge packets.

12. The adaptive filter of claim 11, wherein said storage modules comprise floating gate sensing electrodes, each of which are operable to provide a potential thereon corresponding to a charge packet.

13. The adaptive filter of claim 12, wherein said multipliers comprise analog-digital multipliers.

14. The adaptive filter of claim 13, wherein said multipliers comprise multiplying digital-to-analog converters.

15. The adaptive filter of claim 12, wherein said second multipliers comprise analog-digital multipliers.

16. The adaptive filter of claim 15, wherein said multipliers comprise multiplying digital-to-analog converters.

17. The adaptive filter of claim 1, wherein said input signal comprises an analog signal.

18. The adaptive filter of claim 1, wherein said input signal comprises a digital signal.

19. The adaptive filter of claim 1, wherein said delay line, said multipliers, said summation circuit, and said updating circuit are integrated on a single microprocessing chip.

20. The adaptive filter of claim 1 further comprising an iterative control unit operable for controlling said updating circuit to generate said updatable weighting coefficients at predetermined iterations.

21. The adaptive filter of claim 1, further comprising a differencing circuit coupled between said summation circuit and a reference signal source, said differencing circuit operable for calculating said error signal and providing it to said updating circuit.

22. The adaptive filter of claim 1, wherein said updating circuit comprises a second input signal delay line including a second plurality of storage modules operable for successively shifting discrete samples of said input signal along said second delay line.

23. The adaptive filter of claim 22 further comprising a delay circuit through which said input signal passes prior to being applied to said second delay line.

24. The adaptive filter of claim 22, wherein said updating circuit further comprises a second plurality of multipliers respectively coupled to each of said second plurality of storage modules, each of said second multipliers operable for generating an output corresponding to the product of the discrete sample of said input signal received from a respective second storage module and said discrete portions of said error signal.

25. The adaptive filter of claim 24, wherein said updating circuit further comprises a second summation circuit operable for providing an output signal corresponding to said updating factor.

26. The adaptive filter of claim 24, wherein said second delay line comprises a charge transfer device.

27. The adaptive filter of claim 26, wherein said charge transfer device comprises a charge coupled device shift register.

28. A method of adaptive filtering comprising the steps of:

successively shifting and holding discrete samples of a charge domain input signal along a multi-stage signal input tapped delay line which includes a plurality of storage modules;

generating outputs from each of a plurality of parallel multipliers respectively coupled to each of said storage modules, each of said outputs corresponding to the product of the discrete sample of said input signal received from a respective storage module and an updatable weighting coefficient;

generating an output signal corresponding to the sum of said products generated from said multipliers; and simultaneously providing distinct and synchronized updatable weighting coefficients to each of said multipliers, each of said updatable weighting coefficients corresponding to the sum of a predetermined weighting coefficient and an updating factor, said updating factor corresponding to a product of discrete samples of said input signal and discrete portions of an error signal determined as the difference between said output signal and a predetermined reference signal, wherein said step of providing updatable weighting coefficients comprises successively shifting discrete samples of said input signal along a second multi-stage signal input tapped delay line including a second plurality of storage modules, and generating outputs from each of a plurality of multipliers respectively coupled to each of said second plurality of storage modules, each of said outputs corresponding to the product of the discrete sample of said input signal received from a respective second storage module and said discrete portions of said error signal.

29. An adaptive filtering system comprising:

an input signal delay line including a plurality of storage modules operable for successively shifting discrete samples of an input signal along said delay line;

a plurality of parallel multipliers respectively coupled to each of said storage modules, each of said multipliers operable for generating an output corresponding to the product of the discrete sample of said input signal received from a respective storage module and a distinct updatable weighting coefficient;

a summation circuit operable for providing an output signal corresponding to the sum of said products generated from said multipliers; and a weighting coefficient updating circuit including a plurality of parallel weighting coefficient updating circuit portions respectively coupled to each of said plurality of multipliers and operable for simultaneously providing to each of said multipliers said distinct updatable weighting coefficients, said distinct updatable weighting coefficients corresponding to a sum of a predetermined weighting coefficient and an updating factor, said updating factor corresponding to a product of discrete samples of said input signal and discrete portions of an error signal determined as the difference between said output signal and a predetermined reference signal, wherein said updating circuit comprises a second input signal delay line including a second plurality of storage modules operable for successively shifting discrete samples of said input signal along said second delay line, and a second plurality of multipliers respectively coupled to each of said second plurality of storage modules, each of said second multipliers operable for generating an output corresponding to the product of the discrete sample of said input signal received from a respective second storage module and said discrete portions of said error signal.

30. The adaptive filter of claim 29, wherein said delay line comprises a charge transfer device.

31. The adaptive filter of claim 30, wherein said charge transfer device comprises a charge coupled device shift register.

32. The adaptive filter of claim 31, wherein said discrete samples of said input signal comprise charge packets.

33. The adaptive filter of claim 32, wherein said storage modules comprise floating gate sensing electrodes, each of which are operable to provide a potential thereon corresponding to a charge packet.

34. The adaptive filter of claim 33, wherein said multipliers comprise analog-digital multipliers.

35. The adaptive filter of claim 34, wherein said multipliers comprise multiplying digital-to-analog converters.

36. The adaptive filter of claim 33, wherein said second multipliers comprise analog-digital multipliers.

37. The adaptive filter of claim 36, wherein said multipliers comprise multiplying digital-to-analog converters.

38. The adaptive filter of claim 29, wherein said input signal comprises an analog signal.

39. The adaptive filter of claim 29, wherein said input signal comprises a digital signal.

40. The adaptive filter of claim 29, wherein said delay line, said multipliers, said summation circuit, and said updating circuit are integrated on a single microprocessing chip.

\* \* \* \* \*